United States Patent [19]

Kohl et al.

[11] Patent Number: 5,468,688

[45] Date of Patent: Nov. 21, 1995

[54] PROCESS FOR THE LOW TEMPERATURE CREATION OF NITRIDE FILMS ON SEMICONDUCTORS

[75] Inventors: Paul A. Kohl, Atlanta; Kirkland W. Vogt, Doraville, both of Ga.

[73] Assignee: Georgia Tech Research Corporation, Atlanta, Ga.

[21] Appl. No.: 146,876

[22] Filed: Nov. 1, 1993

[51] Int. Cl.$^6$ .................................................. H01L 21/18
[52] U.S. Cl. .................................................. 437/237
[58] Field of Search .................................. 437/236, 237, 437/235, 244, 243

[56] References Cited

U.S. PATENT DOCUMENTS

| | | | |
|---|---|---|---|
| 3,767,483 | 10/1973 | Tokuyama et al. | 148/186 |
| 3,784,402 | 1/1974 | Reedy, Jr. | 117/69 |
| 3,787,223 | 1/1974 | Reedy, Jr. | 117/69 |
| 3,856,587 | 12/1974 | Yamazaki et al. | 148/187 |
| 4,226,897 | 10/1980 | Coleman | 427/39 |
| 4,448,633 | 5/1984 | Shuskus | 156/610 |
| 4,686,559 | 8/1987 | Haskell | 357/54 |
| 4,714,518 | 12/1987 | Satyanarayan et al. | 156/635 |
| 4,735,921 | 4/1988 | Soukiassian | 437/235 |
| 4,988,640 | 1/1991 | Bohling et al. | 437/81 |
| 5,162,886 | 11/1992 | Nishibayashi et al. | 257/421 |
| 5,358,890 | 10/1994 | Sivan et al. | 437/64 |
| 5,384,285 | 1/1995 | Sitaram et al. | 437/200 |

FOREIGN PATENT DOCUMENTS

| | | | |
|---|---|---|---|
| 57-090121 | 12/1983 | Japan | H01L 21/318 |
| 2-270325 | 11/1990 | Japan | H01L 21/318 |

OTHER PUBLICATIONS

Structural Control of GaN Films Grown on (001) GaAs Substrates by GaAs Surface Pretreatments, Fujieda.
Peden, Charles H. F. and Stuart B. Van Duesen, Summary Abstract: Growth kinetics of thermally nitrided Si (100) by $N_2H_4$, J. Vac. Sci. Tech. A5 Jul./Aug. 1987, p. 2024.
Vogt, Kirkland W. and Paul A. Kohl, Gallium arsenide passivation through nitridation and hydrazine, J. Appl. Phys. 74(10), 15 Nov. 1993, pp. 1–4.
Slaughter, Elizabeth A. and John L. Gland, $N_2H_4$ and $NH_3$ as precursors for silicon nitride thin film growth, J. Vac. Sci. Technol. A 10(1), Jan./Feb. 1992, pp. 66–68.
Fujieda, Shinji, and Yoshishige Matshumoto, Structure Control of GaN Films Grown on (001) GaAs Substrates . . . , Jap. Jrnl. Appl. Phys, pp. L 1665–L 1667.
Runyan, W. R. and K. E. Bean, Semiconductor Integrated Circuit Processing Technology, pp. 121–149.

*Primary Examiner*—R. Bruce Breneman
*Assistant Examiner*—Matthew Whipple
*Attorney, Agent, or Firm*—Hopkins & Thomas; Scott A. Horstemeyer

[57] ABSTRACT

Processes (30, 40) have been developed for forming nitride films (35, 45, 37, 47) at low temperatures and at near atmospheric pressure on sample materials 12, including metals, for example, Co, Cr, Fe, Mo, Si, Ta, Ti, V, and W, and including group IV and group III–V semiconductors, for example, Si and GaAs, respectively. The processes (30, 40) are performed using a reaction system (10) which comprises a reactor (11) enclosed within a dry box (13), a hydrazine bubbler (18), gas sources (14a–14e), and an optional gas disposal system (22) for disposing of exhaust from the reactor (11). The surface of the sample material (12) is initially cleaned to remove any oxides and carbon compounds. The surface is then maintained at a temperature between 0° and 400° C. and at a pressure between 0.001 and 10,000 Torr. The surface is treated with hydrazine by introducing the hydrazine in a gaseous phase over the surface. Nitrogen reactants are formed by the breakdown of the hydrazine, and the nitrogen reactants combine with and consume a portion of the sample material 12 to form a nitride film (35, 45). A thicker nitride film (37, 47) is created by the chemical vapor deposition of boron nitride over the thin nitride film (35, 45).

9 Claims, 2 Drawing Sheets

PROCESS FOR THE LOW TEMPERATURE CREATION OF NITRIDE FILMS ON SEMICONDUCTORS

FIELD OF THE INVENTION

The present invention generally relates to chemical processes for growing thin and thick films on materials, and more particularly, to processes for creating nitride films on metals and on group III–V or group IV semiconductors at low temperature and at desirable pressures without using high energy particles, found in plasmas, ion beams, or the like.

BACKGROUND OF THE INVENTION

Nitride films are of interest for the passivation of semiconductor devices, hardening of metal surfaces, and stabilization of transition metals. When nitride films are applied to semiconductors, the films may function as electrical insulation, chemical resistance, and/or mechanical protection.

Nitride films are commonly formed on other materials via chemical vapor deposition (CVD) using nitrogen ($N_2$) gas and/or ammonia gas ($NH_3$). CVD in the context of this document means any and all chemical forms of deposition from the gas phase. Generally, during the formation of these nitride films, a high energy source is used to break, or crack, the bonds of these gaseous compounds in order to generate nitrogen reactants. These compounds are usually cracked either by using high temperatures, for instance, between 700°–1000° C., or by using plasma or ion beam deposition, where high energy nitrogen ions in the gas phase are projected against a material to be coated or covered. The nitrogen reactants then combine with elements at the surface of the material in order to form the nitride film.

Generally, the aforementioned conventional techniques for forming the nitride films are undesirable in a commercial setting, for example, in the manufacture of integrated circuits. If high temperatures are used to create the nitrogen reactants, then the substrate and/or other materials residing on the substrate, for instance, metals, decompose or are altered undesirably because their melting points are surpassed. As an example, consider a gallium arsenide (GaAs) substrate which decomposes at or above 500° C. Moreover, high energy particles, such as particles projected onto a substrate by plasma or ion beam deposition, create undesirable crystalline defects and/or cavities as the high energy particles bombard the substrate surface.

It has been shown in the art that hydrazine ($N_2H_4$) can be used as a nitriding agent with silicon substrates in order to form thin films of silicon nitride ($Si_3N_4$). See C. Peden et al., "Summary Abstract: Growth Kinetics of Thermally Nitrided Si(100) by $N_2H_4$," *J. Vac. Sci. Technol.*, vol. A5 (4), pp. 2024–2025, July/August 1987, and also, E. A. Slaughter et al., "$N_2H_4$ and $NH_3$ as Precursors for Silicon Nitride Thin Film Growth," *J. Vac. Sci. Technol.*, vol. A10 (1), pp. 66–68, January/February 1992. In the Peden experiments, nitride films were grown using CVD on a silicon substrate at temperatures below 800° C., particularly, at just above room temperature (greater than 50° C.), and with a substrate pressure of about $1.5 \times 10^-$ Torr. Following hydrazine treatment, the films were heated to 550° C. to remove hydrogen which was incorporated during growth. In the Slaughter experiments, nitride films were grown via CVD on a silicon substrate using hydrazine with a substrate temperature of 23° C. (250° K.) and a substrate pressure of about $2 \times 10^{-10}$ Torr.

Although meritorious to an extent, the foregoing low temperature techniques for forming nitride films on silicon are disadvantageous because these processes are performed at ultrahigh vacuum conditions (>>atmospheric pressure= 760 Torr), which are not easily realized in commercial applications. Even if realized, the commercial process would be unjustifiably expensive and burdensome, and the ultrahigh vacuum conditions can adversely affect other compounds in and on the substrate near the nitride formation. Furthermore, it should be noted these experiments do not suggest procedures for applying nitride films to metals or other semiconductors.

It has further been shown in the art that hydrazine can be used as a nitriding agent with gallium arsenide (GaAs) substrates in order to form thick films, i.e., substrates, of gallium nitride (GAN). See S. Fujieda et al., "Structure Control of GaN Films Grown on (001) GaAs Substrates by GaAs Surface Pretreatments," *Japanese Journal of Applied Physics.*, Vol. 30, No. 9B, pp. 1665–1667, September 1991. In the Fujieda experiments, a GaN film of about 1000 angstroms was formed from a GaAs substrate at 500, 600, and 620° C. The GaN film was grown using metal-organic-CVD (MOCVD) with hydrazine and trimethylgallium (TMG) as sources. At the start of film growth, hydrazine was only introduced for a pretreatment before the addition of TMG. The hydrazine pressure was set at $2 \times 10^{-4}$ Torr.

However, the Fujieda process is undesirable and unacceptable for creating nitride films on GaAs and for commercial applications. The apparent focus of Fujieda was the MOCVD deposition of crystalline gallium nitride onto gallium arsenide using trimethylgallium and hydrazine as sources. A $N_2H_4$ pretreatment provided a more appropriate crystalline surface orientation for the MOCVD deposition. The substrate temperatures, i.e., 500, 600, and 620° C., are still too high for the coextensive existence of many metals, substrates, and other materials. In fact, the high temperatures in Fujieda unquestionably adversely affected and decomposed GaAs regions remote from the GaN formation because it is well known in the art that GaAs begins to decompose at about 500° C. Furthermore, undesirable vacuum conditions must be maintained in the Fujieda process. Finally, the Fujieda process does not suggest a procedure for creating nitride films with metals or other semiconductors.

Thus, there is an unaddressed need in the art for processes for creating nitride films on metals and semiconductors at low temperature and at desirable pressures without using high energy particles, such as in plasma or ion beam deposition.

SUMMARY OF THE INVENTION

An object of the present invention is to overcome the deficiencies and inadequacies of the prior art as noted above and as generally known in the art.

Another object of the present invention is to provide a process and system for producing thin and thick nitride films on substrates at low temperature.

Another object of the present invention is to provide a process and system for producing thin and thick nitride films on substrates at commercially practical pressures. Another object of the present invention is to provide a process and system for producing thin and thick nitride films on substrates without using high energy particles, such as in plasma or ion beam deposition.

Another object of the present invention is to provide a process and system for producing nitride films on metals.

Another object of the present invention is to provide a process and system for producing nitride films on group III–V (including GaAs) or group IV (including Si) semiconductors.

Briefly stated, the present invention is a process and system for creating nitride films on metals or group III–V or group IV semiconductors at low temperatures and at desirable pressures without using high energy particles, such as in plasma or ion beam deposition. The process includes the following steps. The surface of the metal or the group III–V or group IV semiconductor is initially cleaned. During this procedure, any and all oxides and carbon compounds are removed from the surface of the material. The surface is then maintained at a temperature preferably between 0° and 400° C., and at a pressure between 0.001 Torr and 10,000 Torr (760 Torr=atm pressure). Next, the surface is treated with hydrazine (or hydrazine derivative) by introducing the hydrazine in a gaseous phase over the surface via CVD. The temperature and pressure conditions result in a nitride film being created on the surface of the material. In essence, nitrogen reactants are formed by the breakdown of the hydrazine, and the nitrogen reactants combine with and consume a portion of the substrate to form the thin nitride film. A catalyst may be introduced along with the hydrazine in order to select the particular temperature and pressure operating conditions. The catalyst helps to break down the hydrazine in order to generate the nitrogen reactants.

In order to form thicker nitride films on a material in accordance with the present invention, the preceding process is performed so that nitride formation is commenced. Then, after a thin film of nitride has been grown on the material by the process of nitrogen reactants combining with and consuming a portion of the material, boron reactants are introduced along with the hydrazine so that boron nitride is formed thereafter over the thin film layer. Hence, a thick nitride film is produced.

An advantage of the present invention is that nitride films can be formed on substrates using process conditions which are easily achievable in a commercial setting.

Another advantage of the present invention is that nitride films can be formed on other materials within the range of 0° to 400° C.

Another advantage of the present invention is that nitride films can be formed on other materials at pressures within the range between 0.001 Torr and 10,000 Torr.

Another advantage of the present invention is that a high quality junction, virtually free of impurities, can be formed between a nitride film and a substrate, including but not limited to, metal, silicon (Si), or gallium arsenide (GaAs).

Another advantage of the present invention is that nitride films can be applied to semiconductors for use as gates in transistors, isolation barriers between transistors, moisture barriers, and in numerous other applications within integrated circuit technology.

Other objects, features, and advantages of the present invention will become apparent to one of skill in the art upon examination of the drawings submitted herewith and the detailed description set forth below.

BRIEF DESCRIPTION OF THE DRAWINGS

The present invention can be better understood with reference to the following drawings. The drawings are not necessarily to scale, emphasis instead being placed upon clearly illustrating principles of the present invention

DETAILED DESCRIPTION OF THE PREFERRED EMBODIMENTS

Figure 1:
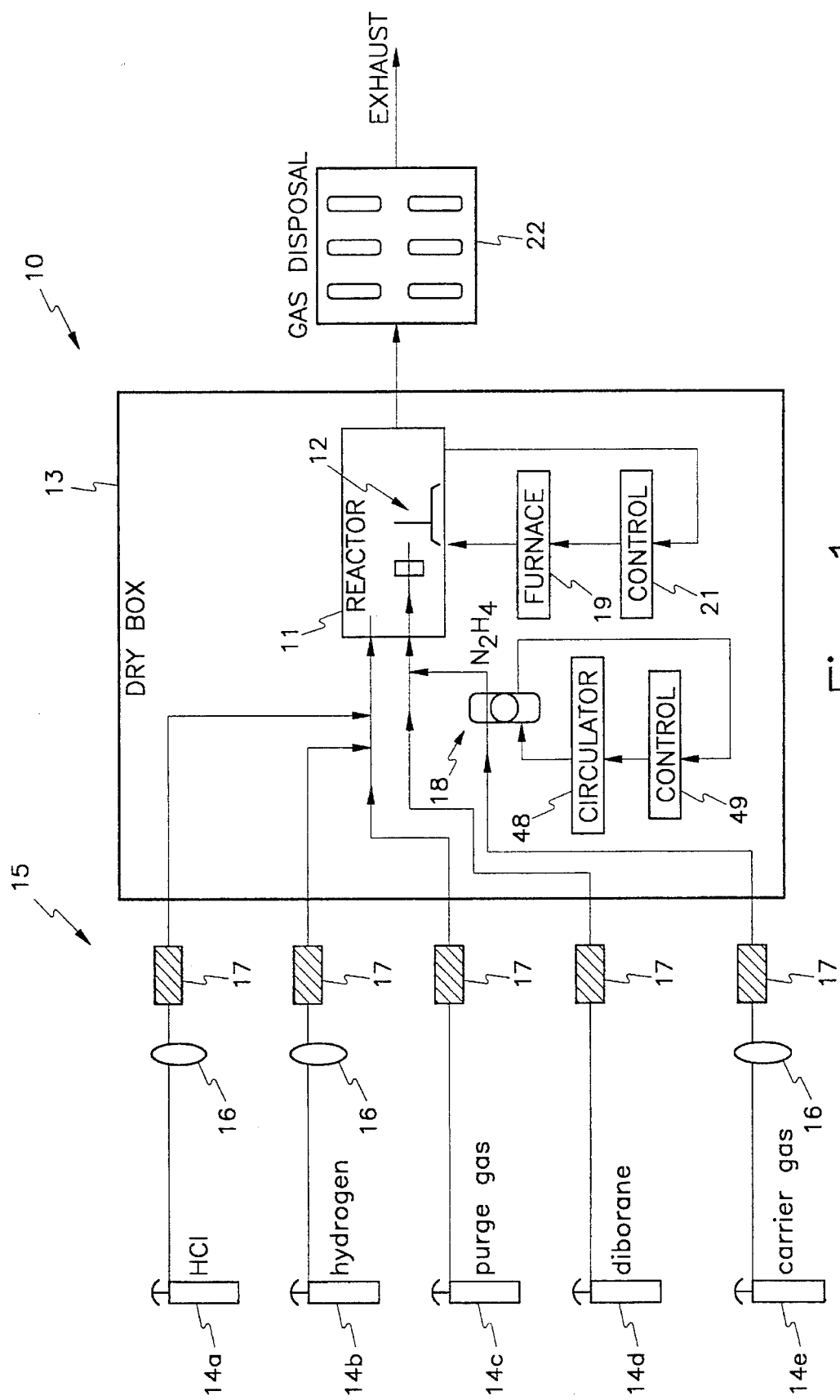
FIG. 1 is a schematic diagram illustrating the novel reaction system of the present invention.
Figure 2:
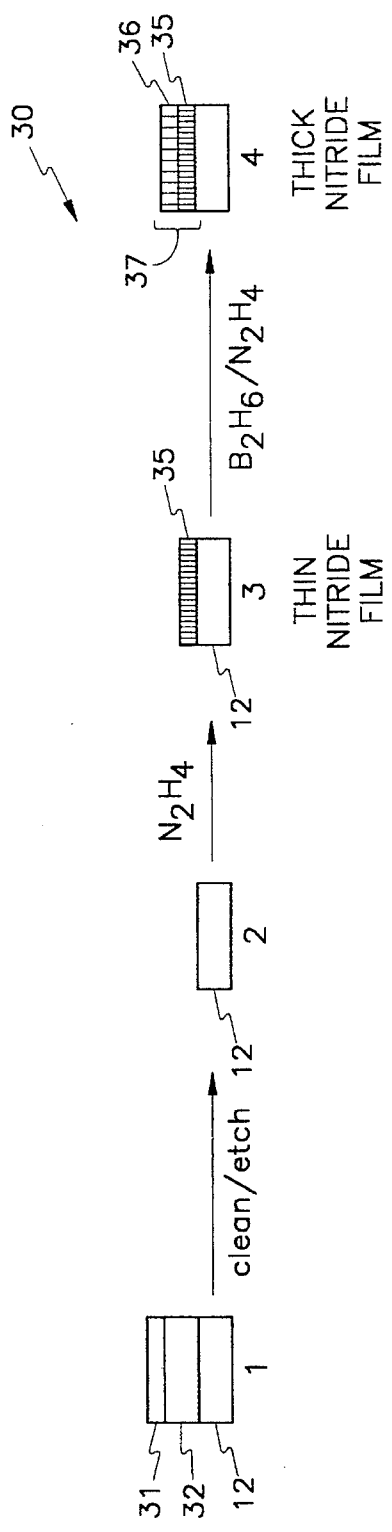
FIG. 2 is a schematic diagram illustrating a novel process for producing a nitride film on a metal or group IV semiconductors using the system of FIG. 1.
Figure 3:
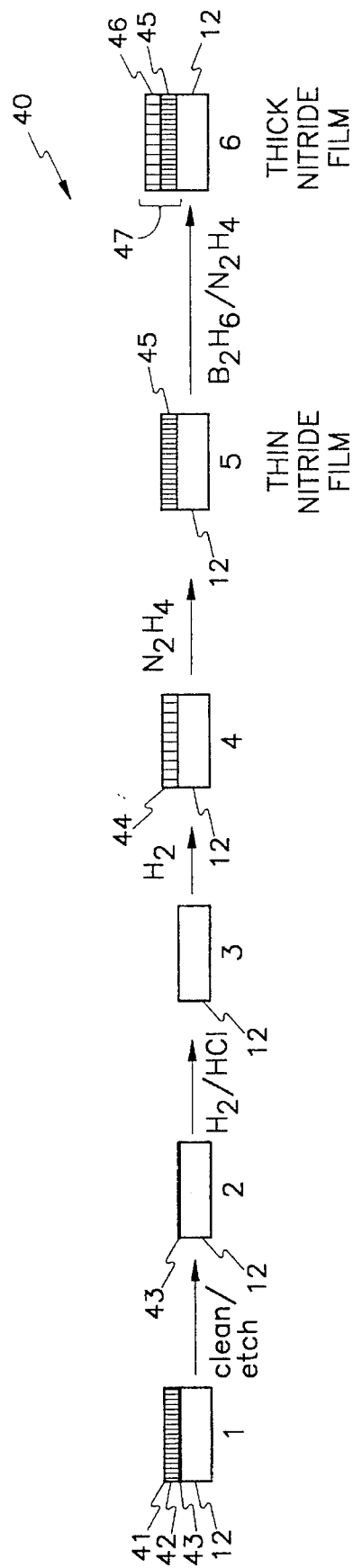
FIG. 3 is a schematic diagram illustrating a novel process for producing a nitride film on a group III–V semiconductor using the system of FIG. 1.

With reference now to the drawings wherein like reference numerals designate corresponding parts throughout the several views, FIG. 1 shows a reaction system 10 for performing the novel processes 30, 40 illustrated in respective FIGS. 2 and 3. The novel processes 30, 40 have been developed in order to form nitride films at low temperatures and practical pressures (e.g., without using ultrahigh vacuum conditions) on metals and on group III–V and IV semiconductors without using high energy particles, such as in plasma or an ion beam deposition.

The reaction system 10 comprises a stagnation flow, hot wall, CVD reactor 11 which houses a sample material 12 for receiving a nitride film and which is contained within a nitrogen-filled dry box 13. Ultrahigh purity gases 14a–14e are fed into the reactor 11 with a gas handling system constructed from electropolished stainless steel tubing, VCR fittings, and butt-coupled arc welds. The gas handling system 15 comprises a plurality of purifiers 16 for minimizing water and oxygen concentrations within the gases below 1 ppm. Further, the gas handling system 15 comprises a plurality of mass flow controls 17 for minimizing mass flow fluctuations of the various gases 14a–14e. In the preferred embodiment, the gas handling system 15 exhibited a leak rate of less than $1\times10^{-9}$ cc/sec as measured with a mass spectrometer/helium-leak test.

Hydrazine ($N_2H_4$) is introduced into the reactor 11 with a bubbler 18 and a carrier gas 14e, preferably inert argon. The carrier gas flow rate and temperature of the hydrazine (i.e. vapor pressure) are used to control the mass flow rate into the reactor 11. The temperature of the hydrazine is controlled with a constant temperature bath surrounding the bubbler 18. The constant temperature circulator 48 heats or cools and circulates a heat transfer fluid, preferably syltherm XLT, which is used for the bath under the control of a temperature control unit 49, which monitors the temperature of the bath and bubbler 18. The reactant gases are injected into the center of the reactor 11 and impinged onto the sample material 12. The reactor 11 is heated with a suitable tube furnace 19, preferably a Lindberg model 30764-026 tube furnace manufactured by Lindberg Corporation, Watertown, Wis., U.S.A., and the temperature within the reactor 11 is controlled with a suitable control system 21, preferably a Lindberg model 30783-021 PID control system. The reactor 11 has an O-ring gasket sealed door for removal and placement of the sample material 12. To minimize contamination from the air during the transfer of the sample material 12, the reactor 11 is surrounded with nitrogen contained within the dry box 13. The dry box 13 also serves as a safety contaminant chamber for the hydrazine during loading, use, and storage. The reaction by-products and unreacted gases exit the reactor 11 and are treated in a gas disposal system 22. The gas disposal system 22 preferably comprises an oil bubbler and several 5% sodium hypochlorite bubblers for hydrazine disposal.

Generally, the processes of present invention can be generally summarized as follows with reference to FIG. 2. As shown in FIG. 2, the surface of the sample material 12 (structure 1 of FIG. 2) is first cleaned (for example, degreased and/or etched) in order to derive a sample material 12 surface free of impurities and contaminants, (structure 2 of FIG. 2) for example, carbon compounds 31 and oxides 32. The cleaning procedure differs depending upon the composition of the sample material 12, as will be further described. After the surface has been cleaned, the surface is treated with hydrazine. While being treated with hydrazine, the sample material 12 is maintained at a temperature which is approximately between 0° and 400° C. and at a pressure approximately between 0.001 Torr and 10,000 Torr. As the surface is treated with hydrazine, a nitride film 35 is formed on the surface (structure 3 of FIG. 2). The nitride film 35 is created by nitrogen reactants combining with and consuming part of the sample material 12. At the prescribed temperatures and pressures, hydrazine easily cracks, thereby creating the desired nitrogen reactants. It is well known that hydrazine is an endothermic compound that readily decomposes in reactive nitrogen and hydrogen species at low temperatures. In this regard, see E. W. Schmidt, *Hydrazine and Its Derivatives*, Wiley, New York, 1984.

A catalyst may be introduced into the reactor 11 along with the hydrazine in order to select the particular temperature and pressure operating conditions. The catalyst would help to break down the hydrazine in order to generate the nitrogen reactants. Suitable catalysts would include, for example but not limited to, Pt, Pd, Rh, and In. In order to introduce the catalyst, a frit (not shown) or a porous mesh (not shown) comprising the catalyst could be disposed in the hydrazine gas stream, preferably near the surface of the sample material 12.

It should be emphasized that the cleaning process is significant in the present invention. If impurities, such as oxides, water, and other contaminants, are not removed from the surface of the sample material 12, then low quality, nonstoichiometric films will be made.

In order to form a thicker nitride film on the sample material 12 as shown in FIG. 2, boron reactants are introduced along with the hydrazine so that boron nitride (BN) 36 is formed over the thin nitride film 35 (structure 4 of FIG. 2). In the preferred embodiment, diborane ($B_2H_6$) gas from diborane source 14d of FIG. 1 is passed into the reactor 11 as a source of boron reactants. Hence, a thick nitride film 37 is produced.

The foregoing procedure was successfully performed to produce high quality thin and thick nitride films on metals and both group III–V and IV semiconductors. Specifically, the metals included Co, Cr, Fe, Mo, Ta, Ti, V, and W, and the group III–IV and V semiconductors included Ga, As, and Si, respectively. Needless to say, one skilled in the art will understand that the principles of the present invention are applicable to a host of other similar elements and compounds, and that the foregoing list is not meant to be an exhaustive list for applicability of the present invention. Experimental implementation of the present invention utilizing the foregoing compositions as the sample material 12 is set forth hereafter in the following examples.

Example I

The nitridation of the metals Co, Cr, Fe, Mo, Ta, Ti, V, and W was investigated using the reaction system 10 of FIG. 1 and the process 30 of FIG. 2. All of the sample materials 12 were of high quality (greater than 99.99%) metal foils, except chromium which was a large, flat metal strip.

Each metal was nitrided separately to prevent cross-contamination between samples. The following procedure was performed for each metal. Initially, the metal sample materials 12 were cleaned. The metal sample materials 12 were degreased with 111-trichloroethane, acetone, and methanol for 30 seconds each, rinsed in distilled water for 1 minute, and dried with nitrogen. This degreasing process removed any carbon or carbon compounds on the sample material 12. Detrimental oxides were removed by dipping the metal in an acid etching solution for 30 seconds.

The metal sample material 12 was placed in the reactor 11 of the reaction system 10. The reactor 11 was purged with 1,000 sccm argon from purge gas source 14c for 60 minutes while the temperature was increased by the furnace 19 to approximately 400° C. Pressure within the reactor 11 was maintained at substantially atmospheric pressure (760 Torr). A 1% anhydrous hydrazine (in argon) gas stream was introduced into the reactor 11 at 200 sccm using the argon carrier gas source 14e in combination with the hydrazine gas bubbler 18 and was impinged on the sample material 12 in the center of the hot zone of the reactor 11. After 1 hour, the hydrazine flow was stopped, and the reactor 11 was cooled and purged again with 1,000 sccm UHP argon from the purge gas source 14c for 30 minutes. The resultant nitride film 35 uniformly covered the entire metal sample material 12. The sample material 12 was removed and stored in a remote dry box (not shown) with less than 1 ppm each of oxygen and water until it could be analyzed.

Extensive analysis indicated growth of nitride films on the metals. Generally, the nitrogen mole fraction was large at the surface and decreased in the bulk of the film. This suggests that kinetic and diffusion limitations control the reaction mechanism.

Example II

The nitridation of silicon was also investigated. A silicon sample material 12 was obtained with n-type doping and with a carrier concentration of $3\times10^{-16}$. The procedure of Example I was substantially repeated with the following modifications. After the silicon sample material 12 was degreased in order to remove carbon and/or related carbon compounds, the silicon sample material 12 was then treated with hydrofluoric acid in order to remove oxides from the surface. After the procedure and application of hydrazine, a film uniformly covered the entire silicon sample material 12. The film was extensively analyzed and determined to be a high quality silicon nitride ($Si_3N_4$) film.

Example III

The formation of thick nitride films on silicon sample material 12 was investigated. Boron nitride BN was formed over a thin film of silicon nitride, as formed in Example II. The procedure of Example II was substantially repeated and then the following was performed after formation of the thin silicon nitride film. Diborane ($B_2H_6$) gas from diborane source 14d of FIG. 1 was passed into the reactor 11 along with the hydrazine gas from bubbler 18 as a source of boron reactants. These boron reactants caused the formation of BN 36 over the silicon nitride. The film was analyzed and determined to have a high quality thick nitride film 37 (approximately 500–1,000 angstroms in thickness) on its surface.

Example IV

A sample material 12 of GaAs with an n-type carrier concentration of $3\times10^{-16}$ was investigated. The cleaning and preparation procedure was slightly more complex than with previous materials, and therefore, the procedure is illustrated in and will be described relative to FIG. 3.

Prior to nitride growth, several pretreatments of the GaAs sample material 12 (structure 1 of FIG. 3) were made for purposes of cleaning the surface, similarly as with the other materials. Specifically, the GaAs sample material 12 was degreased with 111-trichloroethane, acetone, and methanol, so as to remove any carbon or carbon compounds 41. Oxides 42 were removed with acidic wet etchants and gas phase etchants, particularly, hydrogen chloride (HCl) and hydrogen ($H_2$) (thus producing structure 2 of FIG. 3).

Next, the GaAs sample material 12 (structure 3 of FIG. 3) was positioned in the reactor 11 of the reaction system 10. A gallium-rich surface on the GaAs sample material 12 is important in preventing nitride reactions which are limited by the dissociation of the GaAs. If the surface of the GaAs sample material 12 is initially depleted of arsenic, the reactions will not be limited by the GaAs dissociation, and uniform films of gallium nitride (GAN) can be made. In order to produce a gallium-rich surface 44 on the GaAs sample material 12 (structure 4 of FIG. 3), arsenic (As) 43 was depleted from the near surface region. The surface was reduced by an HCl-$H_2$ treatment at 300°–400° C. and atmospheric pressure. The intent and result of this process was the formation of volatile arsenic hydride and/or chloride species in order to deplete arsenic at the surface.

Finally, nitride growth was performed by exposure of the GaAs sample material 12 having gallium-rich surface 44 to a reactive nitrogen source. Hydrazine was carried with an argon carrier gas from carrier gas source 14e from the hydrazine bubbler 18 into the reactor 11 at 300°–400° C. for 1 hour. Pressure within the reactor 11 was maintained at substantially atmospheric pressure (760 Torr). As a result, gallium nitride was formed on the gallium arsenide surface (structure 5 of FIG. 3).

Typically, exposure of the GaAs sample material 12 to hydrazine for 1 hour produced a very thin nitride layer, generally less than 100 angstroms. The resultant gallium nitride film 45 uniformly covered the entire GaAs sample material 12. AES depth profiles of films grown at 300° and 400° C. were analyzed. Both films were a mixture of oxides and nitrides. Arsenic was depleted from the near surface region of the film and the semiconductor film interface. The oxygen peak to peak approximately doubled when the reaction temperature was increased from 300° to 400° C., while the nitrogen intensity remained nearly the same. After correcting for atomic sensitivities, the AES results showed that the gallium nitride films were nonstoichiometric, with the gallium concentration exceeding the nitrogen concentration. The film thickness, measured by the amount of time needed to etch through the film, also increased when the reaction temperature was increased from 300° to 400° C.

Example V

The formation of thick nitride films on a GaAs sample material 12 was investigated. Boron nitride BN was formed over the thin film of gallium nitride 45, as formed in Example IV. The procedure of Example IV was substantially repeated and then the following was performed after formation of the thin gallium nitride film. Diborane ($B_2H_6$) gas from diborane source 14d of FIG. 1 was passed into the reactor 11 along with the hydrazine gas from bubbler 18 as a source of boron reactants. These boron reactants caused the formation of BN film 46 over the gallium nitride film 45 (structure 6 of FIG. 3). The film was extensively analyzed and determined to be a high quality thick nitride film 47 (approximately 500–1,000 angstroms in thickness).

It will be obvious to those skilled in the art that many variations and modifications may be made to the preferred processes 30, 40 and system 10 of the present invention without substantially departing from the principles thereof. For example, there are many derivatives of hydrazine, and these hydrazine derivatives can be used as a substitute for hydrazine in the present invention to accomplish the same objectives. Further, a protective film can be provided over the nitride films 35 or 37 of FIG. 2, or 45 or 47 of FIG. 3. All such variations and modifications are intended to be included herein within the scope of the present invention, as broadly set forth in the following claims.

Wherefore, the following is claimed by the inventors:

1. A process for creating nitride films on group III–V semiconductors at low temperatures, comprising the steps of:

cleaning a surface of a group III–V semiconductor;

treating said surface with hydrazine in the absence of high energy particles to create a nitride film directly on said surface; and maintaining said semiconductor at a temperature which is less than about 400° C. during creation of said nitride film.

2. The process of claim 1, further comprising the step of applying a protective film over said nitride film.

3. The process of claim 1, further comprising the step of facilitating breakdown of said hydrazine with a catalyst.

4. The process of claim 1, further comprising the step of cleaning said surface by treating said surface with hydrogen gas and gaseous hydrochloric acid.

5. The process of claim 1, further comprising the step of depleting arsenic in said surface prior to treating said surface with said hydrazine.

6. The process of claim 1, wherein said III–V semiconductor is gallium arsenide.

7. The process of claim 1, wherein said step of creating includes a substep of converting said surface of said group III–V semiconductor into said nitride film.

8. The process of claim 7, wherein said nitride film is a group III nitride film.

9. The process of claim 2, wherein said protective layer is boron nitride (BN).

* * * * *

UNITED STATES PATENT AND TRADEMARK OFFICE
CERTIFICATE OF CORRECTION

PATENT NO. : 5,468,688
DATED : November 21, 1995
INVENTOR(S) : Kohl et al.

It is certified that error appears in the above-indentified patent and that said Letters Patent is hereby corrected as shown below:

In column 1, line 55, delete " " " and replace with -- " --.

In column 2, line 21, delete "Vol." and replace with --vol.--

In column 5, line 8, delete ",", and line 9, after "Fig. 2)" insert --,--.

Signed and Sealed this

Nineteenth Day of March, 1996

Attest:

BRUCE LEHMAN

*Attesting Officer*       *Commissioner of Patents and Trademarks*